(12) United States Patent
Littow (10) Patent No.: US 8,604,748 B2
(45) Date of Patent: Dec. 10, 2013

(54) METHODS AND SYSTEMS FOR DETECTING BATTERY PRESENCE

(75) Inventor: Markus Littow, Oulu (FI)

(73) Assignee: ST-Ericsson SA, Plan-les-Ouates (CH)

( * ) Notice: Subject to any disclaimer, the term of this patent is extended or adjusted under 35 U.S.C. 154(b) by 740 days.

(21) Appl. No.: 12/767,986

(22) Filed: Apr. 27, 2010

(65) Prior Publication Data

US 2011/0260755 A1 Oct. 27, 2011

(51) Int. Cl.
*H02J 7/00* (2006.01)

(52) U.S. Cl.
USPC ....................................................... 320/106

(58) Field of Classification Search
USPC ....................................................... 320/106
See application file for complete search history.

(56) References Cited

U.S. PATENT DOCUMENTS

| | | | |
|---|---|---|---|
| 5,534,765 A * | 7/1996 | Kreisinger et al. ........... | 320/106 |
| 6,087,803 A | 7/2000 | Eguchi et al. | |
| 6,104,303 A | 8/2000 | Katada et al. | |
| 6,340,876 B1 * | 1/2002 | Saint-Pierre ................... | 320/106 |
| 7,439,706 B2 | 10/2008 | Brenner | |
| 2005/0075806 A1 | 4/2005 | Phansalkar et al. | |
| 2005/0248309 A1 * | 11/2005 | Denning ......................... | 320/106 |
| 2006/0001401 A1 * | 1/2006 | Krieger et al. ................. | 320/128 |
| 2006/0125446 A1 * | 6/2006 | Tupman et al. ................ | 320/132 |
| 2009/0034672 A1 * | 2/2009 | Cho et al. ....................... | 375/364 |
| 2009/0230778 A1 | 9/2009 | Alfven et al. | |

FOREIGN PATENT DOCUMENTS

EP 1 523 082 A1 4/2005

\* cited by examiner

*Primary Examiner* — Arun Williams
(74) *Attorney, Agent, or Firm* — Patent Portfolio Builders PLLC (57) ABSTRACT

A device has a battery presence detection system. A line charging pulse signal is applied to a terminal battery detection line, which is connected when the battery is present to a ground line via a resistor and a capacitance. A detector determines whether the battery is connected to the mobile terminal based on detecting whether a line voltage edge or a line voltage level on the terminal battery detection line is present.

20 Claims, 5 Drawing Sheets

FIG. 1

(BACKGROUND ART)

METHODS AND SYSTEMS FOR DETECTING BATTERY PRESENCE

BACKGROUND

1. Technical Field

Embodiments of the subject matter disclosed herein generally relate to methods and systems for detecting battery disconnection from a device, thereby allowing the device to be shut down in a controlled manner.

2. Discussion of the Background

In order to shut down in a controlled manner upon an intentional or accidental disconnection of a battery, a device (e.g., a mobile terminal) needs to promptly receive an indication that the battery is physically disconnected. Shutting down in a controlled manner is important for preserving data integrity and security. For example, when an accidental disconnection of the battery from the mobile terminal occurs, it is important that any ongoing data exchange concludes in an orderly manner.

A good battery presence detection system should have some or all of the following properties: a sufficiently short response time (e.g., typically less than 500 µs) in order to allow adequate time for the mobile terminal to shut down in a controlled manner, cost efficient reuse of existing hardware in the device, usable with batteries of various types, use as little power as possible in order to avoid using up the stored energy in the battery, useable long enough after the battery is disconnected to provide the indication needed to shut down the mobile terminal in a controlled manner, and be fault tolerant, so as not to indicate that minor glitches or noise are battery disconnections.

Figure 1:
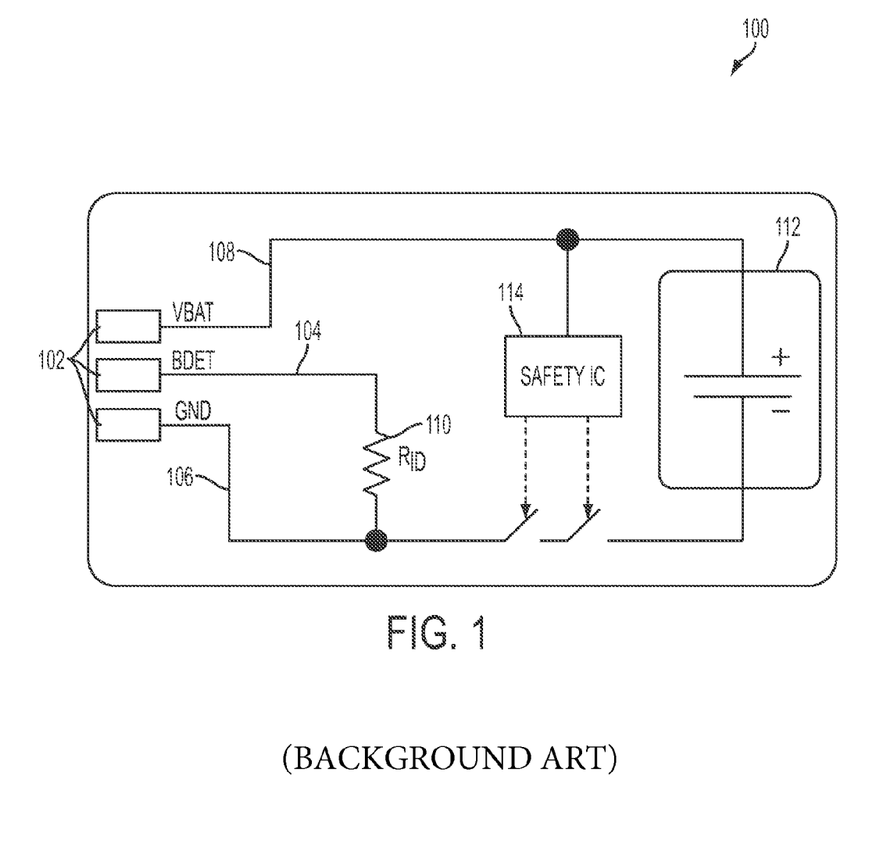
FIG. 1 is a schematic diagram of a typical battery pack.

A typical battery 100, as illustrated in FIG. 1, has physical connectors 102 that are connectable to corresponding physical connectors of a corresponding, battery-powered device (e.g., a mobile terminal). At least three lines, a battery presence detection line (BDET) 104, a battery ground line (GND) 106 and a battery cell voltage line (VBAT) 108 are typically present in the battery and can be connected to the battery-powered device using the physical connectors 102.

The typical battery 100 usually includes a pull-down resistor 110 (RID) connected between the battery presence detection line 104 and the battery ground line 106. The pull-down resistor 110 has a value which typically is dependent on the battery type, but is typically not larger than 200 kΩ. In some batteries, the pull-down resistor 110 is temperature sensitive (or alternatively, the batteries include a resistive network including a temperature sensitive resistor) so that it can also be used to measure the temperature inside the battery 100. The battery 100 further includes a battery cell 112, which provides a battery voltage to the battery cell voltage line (VBAT) 108. The battery 100 also includes a safety integrated circuit 114 to protect the battery, for example, in case of overheating.

A common battery presence detection system includes a pull-up resistor in the battery-powered device, which forms a voltage division configuration in combination with the pull-down resistor 110 in the battery 100. A voltage division value is monitored by a continuous time comparator in the mobile terminal to determine the presence or absence of the battery 100.

The main drawback of the above-described battery presence detection system is that power is wasted by continuously feeding the voltage divider, the fed power being discharged to a ground line either via the pull-up resistor and the pull-down resistor when the battery is connected to the mobile terminal, or only via the pull-up resistor when the battery is not connected to the mobile terminal.

An alternative method used with the above-described battery presence detection system does not continuously provide power to the voltage divider, but instead turns on the battery presence detection system only temporarily. This alternative method has the disadvantage that the turning on/off of the detection system may be relatively slow, for example, allowing detection of whether battery is connected only about once per second. Such a long reaction time of the battery presence detection system is substantially larger than a desirable reaction time which assures a controlled shutdown of the mobile terminal. Additionally, this approach requires that some element of the detection system remain "awake" in order to turn on and off the rest of the detection system.

In recent years, manufacturers have produced smart batteries which allow digital communication with a mobile terminal, e.g., to provide information about a battery type, remaining capacity, etc. Typically, such digital communications have been transmitted over the battery presence detection line. However, the voltage present on this line due to the voltage divider circuit used for detecting the battery presence may interfere with the digital communications over the battery presence detection line. Adding a fourth contact/line to the battery interface to separate the digital communications associated with the smart battery from the battery presence detection is of course possible, but adds complexity and cost to the interface.

Accordingly, it would be desirable to provide battery presence detection systems and methods which overcome the afore-described drawbacks.

SUMMARY

A battery presence detection system of a device according to an embodiment is connectable to a battery, which has a battery detection line connected to a battery ground line of the battery via a pull-down resistor. The device includes a terminal battery detection line configured to be connected to the battery detection line of the battery when the battery is connected to the device, and a terminal ground line configured to be connected to the battery ground line of the battery when the battery is connected to the device.

The device further includes a terminal capacitance that is connected between the terminal battery detection line and the terminal ground line. The device also includes a pulse generator configured to generate a line charging pulse signal applied to the terminal battery detection line, and a detector configured to detect a presence of one of a line voltage edge and a line voltage level on the terminal battery detection line, and output an indication as to whether the battery is connected to the mobile terminal based on the presence of the one of the line voltage edge and the line voltage level on the terminal battery detection line.

According to another embodiment, a device has a battery presence detection system. The device has a terminal communication line, a terminal ground line and a detector configured to detect a presence of one of a line voltage edge and a line voltage level on the terminal communication line, and to output an indication of whether a battery is connected to the device based on the detected presence.

According to another embodiment, a method for detecting whether a battery is connected to a device includes applying a line charging pulse signal to a terminal battery detection line that is connected to a terminal ground line via a pull down resistor and a capacitance while the battery is connected to the device.

The method further includes detecting whether one of a line voltage edge and a line voltage level of a voltage on the terminal battery detection line is present, and determining whether the battery is connected to the device based on the detecting.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology associated with a mobile terminal connected to a typical battery pack. However, the embodiments to be discussed next are not limited to these systems, but may be applied to other systems that require prompt detection of the presence of a battery, e.g., battery chargers or other battery-powered devices.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 2:
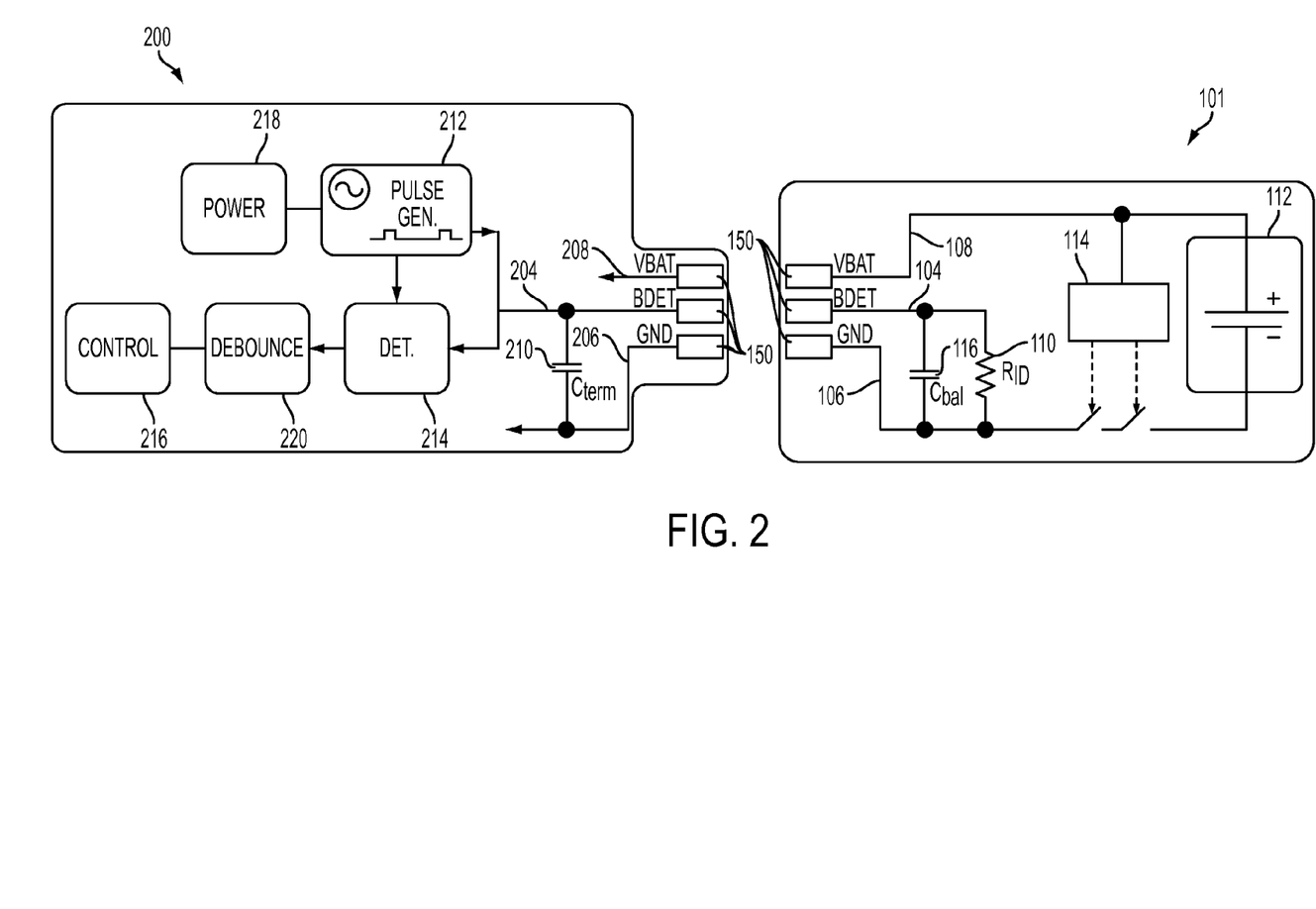
FIG. 2 is a schematic diagram of a mobile terminal which has a battery presence detection system according to an embodiment.

FIG. 2 is a schematic diagram of a mobile terminal 200 which has a battery presence detection system according to an embodiment. The mobile terminal 200 is connectable to a battery 101 similar to the battery illustrated in FIG. 1, and described in the background art section above. Note, however, that unlike the battery of FIG. 1, the battery 101 depicts a capacitance 116 Cbat that, in addition to capacitance in the mobile terminal 200, is exploited by the exemplary embodiments to detect presence or absence of the battery 101 as will be described in more detail below. This capacitance Cbat 116 may be physically present in the battery 100 of FIG. 1, but is not used by conventional battery presence detectors as part of the system for determining whether the battery is connected to a battery-powered device.

In FIG. 2, three pairs of physical connectors 150 are illustrated, but other pairs of physical connectors may exist. In each pair, one physical connector is on the battery side and another physical connector is on the mobile terminal side. When the battery 101 is connected to the mobile terminal 200, the battery presence detection line (BDET) 104, the battery ground line (GND) 106 and the battery cell voltage line (VBAT) 108 in the battery are connected via respective pairs of physical connectors 150 to a corresponding terminal battery presence detection line (BDET) 204, a terminal ground line (GND) 206 and a battery cell voltage line (VBAT) 208 in the mobile terminal 200.

As previously described, inside the battery 101, the battery presence detection line (BDET) 104 is connected to the battery ground line 104 via the resistor RID 110 and the capacitance Cbat 116. Inside the mobile terminal 200, the battery detection line 204 is connected to the terminal ground line 206 via a capacitance Cterm 210. Similar to the capacitance Cbat 116, and as described more below, the capacitance Cterm 210 may include a parasitic capacitance associated with, for example, surge protection electronics of the mobile terminal or alternatively Cterm 210 may include a discrete capacitor component which is, e.g., used to perform filtering. Thus, it will be appreciated by those skilled in the art that the battery presence detection system illustrated in FIG. 2 is cost efficiently reusing hardware already existing in the mobile terminal.

The battery presence detection system inside the mobile terminal 200 includes, according to this exemplary embodiment, a pulse generator 212 that generates a pulse signal applied to the battery detection line (BDET) 204 inside the mobile terminal. This pulse signal has the effect of charging the line capacitance to a known value at regular intervals. The manner in which the known charge value is discharged is then monitored to determine whether the battery is connected or not as will now be discussed with respect to FIG. 3.

Figure 3:
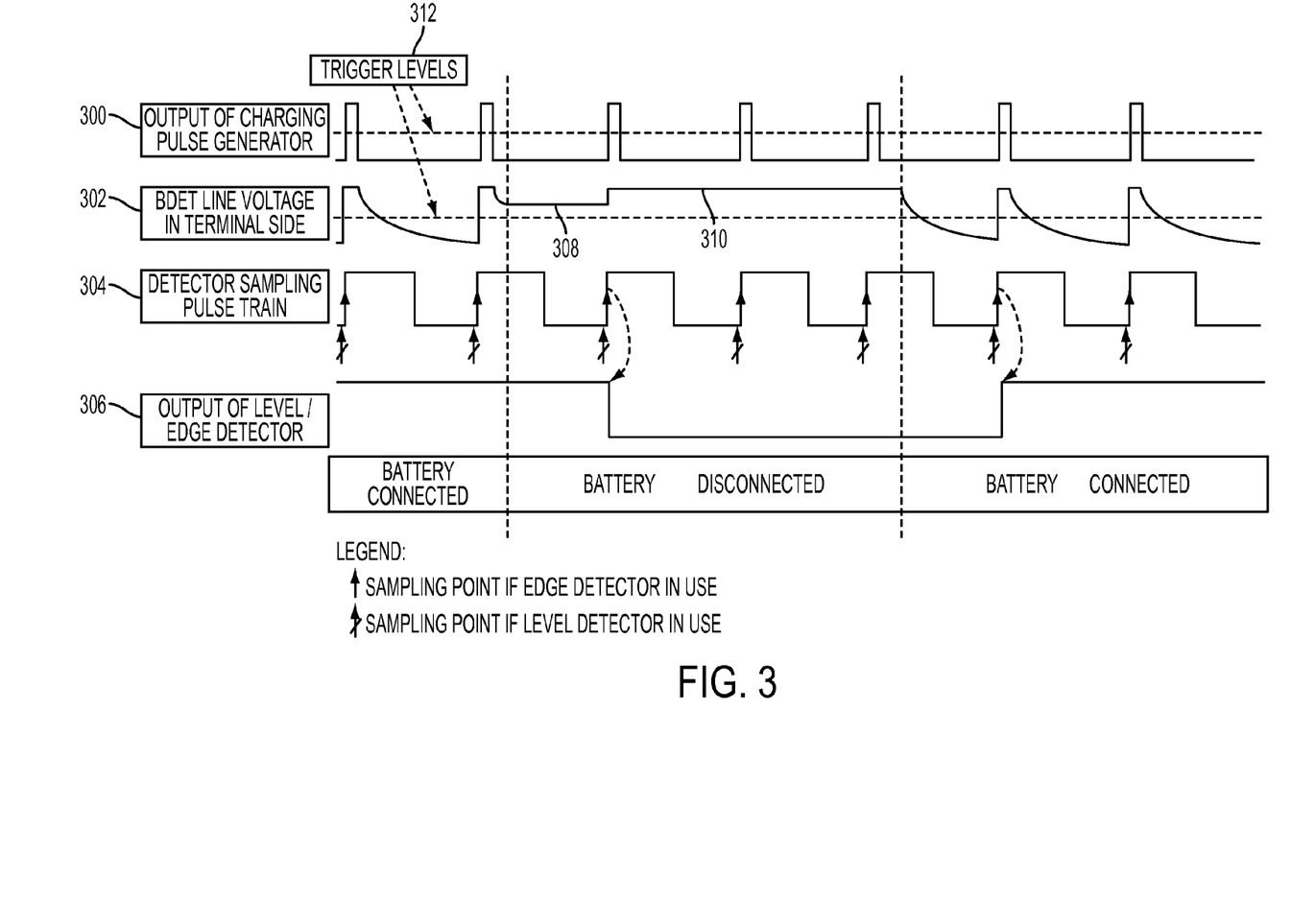
FIG. 3 illustrates exemplary operation waveforms for the embodiment illustrated in FIG. 2.

FIG. 3 illustrates exemplary waveforms (i.e., voltage values as a function of time) for voltages related to components of the embodiment of FIG. 2. As labeled at the bottom of FIG. 3, the graph is separated into three time periods: in a first time period the battery is connected to the mobile terminal, in a second (middle) time period the battery is disconnected from the mobile terminal, and in a third (last) time period the battery is again connected to the mobile terminal.

In the topmost voltage versus time graph 300 in FIG. 3, an exemplary output of the pulse generator 212 is illustrated. The pulse signal is, in this exemplary embodiment, periodical, and includes a first time interval during which the pulse signal has a constant high voltage (i.e., a pulse), and a second time interval during which the pulse signal has a low (zero) voltage, in each period. The pulse generator may be implemented in hardware, firmware, software or a combination thereof and may generate pulses periodically or irregularly.

In order to achieve a response time of less than, for example, 500 µs, the pulse generator 212 generates pulses at an operating frequency of at least a few KHz. However, in order to avoid interfering with audio signals inside the mobile terminals, the operating frequency of the pulse generator 212 can be chosen to be larger than 20 KHz, although this is not a requirement. A typical value of the operating frequency may also be chosen based upon the various oscillators which are already available in the battery-powered device in which the battery detection system according to these exemplary embodiments is being implemented, e.g., about 32 KHz in some mobile terminals.

When the pulse from the pulse generator 212 is applied to the battery detection line (BDET) 204 inside the mobile terminal, the capacitance Cterm 210 is charged, and the voltage on the battery detection line 204 is then equal to the high voltage of the applied pulse as seen in graph 302. If the battery 101 is connected to the mobile terminal 200, the capacitance Cbat 116 is also charged because the battery presence detection line (BDET) 104 inside the battery is connected to the battery presence detection line (BDET) 204 inside the terminal.

After the pulse, the voltage on the BDET line decreases exponentially after each pulse when the capacitances Cterm 210 and Cbat 116 are discharged through the resistor RID 110 as a function of the RC constant of the circuitry. More specifically, a time constant of the exponential decrease can be expressed as:

$$T=RID*(Cterm+Cbat).$$

During the time periods while the battery 101 is connected to the mobile terminal, FIG. 3 illustrates the above-described exponential decrease of the voltage on the battery presence detection line (BDET) 204 inside the terminal while the battery 101 is connected to the mobile terminal.

It will be appreciated by those skilled in the art that if one of the capacitances Cterm or Cbat is absent, or not experienced by the circuit to which the pulse generator 212 is connected, the battery detection system according to exemplary embodiments still functions. Generally speaking, however, there will inherently exist a finite, non-zero amount of capacitance between a hot line on which electrical signals are applied and a ground line. In fact, the capacitance 116 Cbat between the battery presence detection line 104 and the battery ground line 106 may include an unavoidable effect of the traces and dielectrics present in the device for other reasons, such as a parasitic capacity related to the surge protection electronics. For example, batteries used for mobile terminals typically have an 8 KV galvanic surge protection and a 15 KV battery-to-air protection. A capacitance value of the parasitic capacity in either the mobile terminal or the battery is often on the order of tens of pF, frequently about 100 pF, but may be up to 300 pF. Either or both of the capacitances Cbat and Cterm may include parasitic capacitance and/or actual, discrete capacitors.

If the battery 101 is disconnected from to the mobile terminal 200, the capacitance Cterm 210 ceases to discharge and maintains a voltage value as of the moment when the disconnection of the battery from the mobile terminal occurs, until a new pulse is applied. This can be seen by the portion 308 of waveform 302. When, after the disconnection, the new pulse is applied, the voltage on the battery presence detection line (BDET) 204 inside the terminal increases to a maximum value, i.e., the applied pulse voltage, which is then maintained since no further discharge occurs as long as the battery is disconnected. This can be seen by the portion 310 of the waveform 302.

In contrast to conventional battery presence detector systems which include a voltage divider, the battery presence detector system illustrated in FIG. 2 uses less energy by applying pulse signals and not continuous signals. Moreover, having zero energy consumption at the time of battery disconnect allows more time for the rest of the system to perform a controlled shut down, since the detection system is still running from the charge that is left in VBAT line capacitance and/or other regulator capacitances.

The battery presence detection system according to the exemplary embodiment of FIG. 2 further includes a detector 214 configured to detect features of the voltage on the battery presence detection line (BDET) 204 inside the terminal 200. The detector 214 may, for example, be a level detector which detects when the voltage value on the battery presence detection line (BDET) 204 becomes higher than a reference voltage value (i.e., a trigger level 312), which value can be freely selected based upon, for example, the resistance and capacitance values described above associated with the particular device and peripheral of interest and the desired periodicity at which the detection system should check for disconnection.

Alternatively the detector 214 may be a rising edge detector which detects a rising voltage edge for the voltage on the battery presence detection line (BDET) 204. Note that in order to detect the rising voltage edge, the voltage must rise above a trigger voltage value. The detector 214 may be implemented in hardware, firmware, software or as a combination thereof.

The detector 214 samples the voltage on the battery presence detection line (BDET) 204 at predetermined times according to, for example, a detector sampling pulse train 304 illustrated as the third (from top to bottom) voltage versus time graph in FIG. 3. The sampling points may vary depending on whether the detector 214 is a level detector or a rising edge detector as illustrated in FIG. 3. The pulse generator 212 and the detector 214 may be connected so that the pulse signal and the detector sampling pulse train are synchronized.

The detector 214 outputs an indication that the battery is disconnected. For example, the detector 214 outputs a first voltage value if the line voltage edge or the line voltage level of the voltage on the battery presence detection line (BDET) 204 is detected at a preceding sampling time. Conversely, the detector 214 outputs a second voltage value if the line voltage edge or the line voltage level of the voltage on the battery presence detection line (BDET) 204 is not detected at the preceding sampling time. Such an output 306 of the detector 214 is illustrated in the fourth (bottom) voltage versus time graph in FIG. 3.

The indication output by the detector 214 that the battery is disconnected may be received by a control unit 216 configured to shut down the mobile terminal 200 in a controlled manner. The control unit 216 may be implemented in hardware, firmware, software or as a combination thereof.

When shutting down the mobile terminal 200 in a controlled manner, the control unit 216 may shut down also the battery presence detection system (i.e., the detector 214 and the pulse generator 212. However if, prior to completing the shutting down of the mobile terminal 200, the battery presence detection system still operating determines that the battery is again connected, the control unit 216 may abort the shutting down of the mobile terminal. Alternatively, once the shut down process is initiated it can be completed regardless of whether the battery presence detection system determines that the battery is again connected during the shut down process.

The battery presence detection system may further include a remnant power source 218 configured to provide power to the pulse generator 212 and the detector 214 even when the battery becomes disconnected. The remnant power source 218 may be a clock signal generating unit. The remnant power source 218 may also be a temporary power storage unit or element which stores electrical energy that is slowly discharged after the battery 101 becomes disconnected.

As discussed in the background section, a good battery presence detection system should be usable with batteries of various types. Different types of batteries may have different resistance values for the resistor RID 110 and different capacitance values for the capacitance Cbat 116. The values of the resistance and of the capacitance determine the time constant of the exponential decrease of the voltage on the battery presence detection line (BDET) 204 when the battery 101 is connected. A larger time constant, which implies a slower decrease of the voltage, may negatively impact accuracy of determining whether the battery is connected to the mobile terminal by the battery presence detection system.

In order to overcome this problem, the battery presence detection system according to some exemplary embodiments may further include a battery type adjusting unit (e.g. included in the pulse generator 212) configured to adjust a pulse generator frequency according to values of the resistor RID 110 and the capacitance Cbat 116, thereby, allowing, for example, a longer interval during which the voltage on the battery presence detection line (BDET) 204 decreases.

Alternatively, the battery presence detection system may further include a battery type adjusting unit (e.g. included in the pulse generator 212) configured to adjust voltage reference levels used by the detector 214 to detect the presence of the line voltage edge or the line voltage level on the terminal battery detection line 204, according to values of the resistor RID 110 and the capacitance Cbat 116.

The battery presence detection system may also include a digital debounce filter 220 connected to the pulse detector, in order to filter out spurious signals such as minor glitches or noise. Thus, the battery presence detection system including a digital debounce filter 220 is fault tolerant. If, for example, a 32 Khz clock is used in the system and a 500 us minimum disconnection time is required to start the shutdown process, then about 16 consecutive missing pulses in the debounce filter 220 should be counted before releasing the shutdown alarm. This purely illustrative example provides a highly fault tolerant technique for determining disconnection of the peripheral device.

Figure 5:
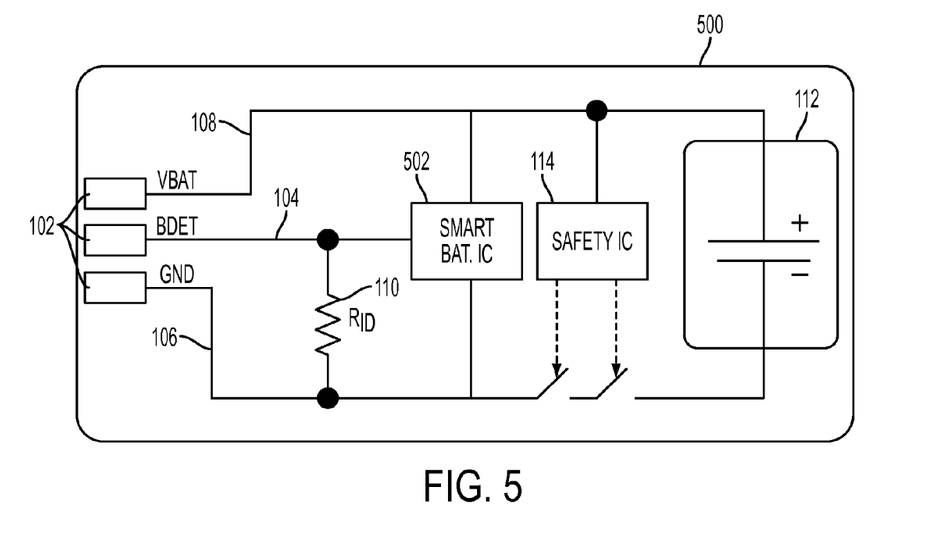
FIG. 5 is a schematic diagram of a smart battery pack.

According to another embodiment, e.g., designed to detect the presence of smart batteries, the battery detection system omits the pulse generator 212 (but includes the other elements of FIG. 2). An exemplary smart battery 500 is illustrated in FIG. 5, wherein the elements are the same as those described in FIG. 2 for battery 101 except for the inclusion of the smart battery IC 502. In such an exemplary embodiment, a clock signal used in the digital communication between the smart battery and the mobile terminal is applied as the pulse signal to charge the terminal battery detection line. Digital communications can be performed, for example, between the clock signal pulses applied to the BDET line.

Figure 4:
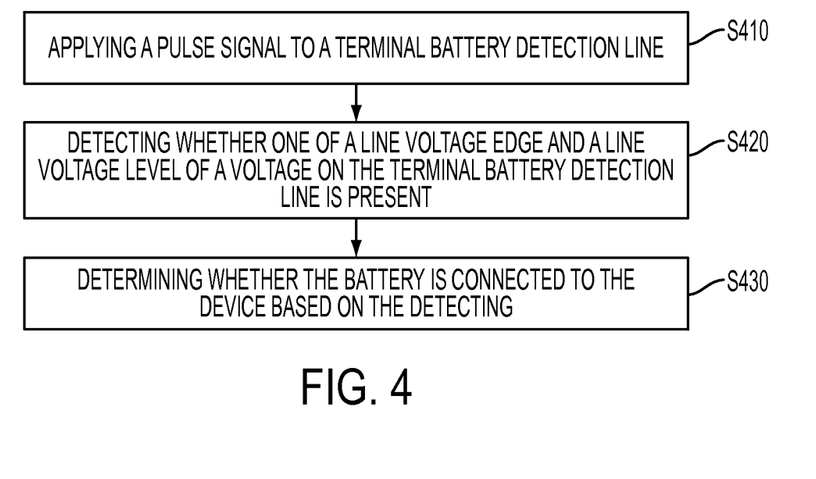
FIG. 4 is a flow diagram of a method of detecting whether a battery is connected to a mobile terminal according to an embodiment.

A flow diagram of a method for detecting whether a battery is connected to a device according to an exemplary embodiment is illustrated in FIG. 4. The method includes applying a pulsed signal to a terminal battery detection line, at S410. The method further includes detecting presence of one of a line voltage edge and a line voltage level on the terminal battery detection line, at S420. The method also includes determining whether the battery is connected to the device based on the detecting, at S430.

According to another embodiment, the method may also include outputting a first voltage value if determined that the battery is connected at a preceding predetermined time, and a second voltage value if determined that the battery is disconnected. In another embodiment, the method may also include shutting down the device in a controlled manner when the determining concludes that the battery is not connected to the device.

In another embodiment, the method may also include adjusting at least one of a pulse generator frequency of the pulse signal and voltage reference levels used to detect the presence of the one of the line voltage edge and the line voltage level on the terminal detection line, according to values of the pull-down resistor and the battery capacitance. According to another embodiment, the method may also include synchronizing a detector sampling pulse train used to select the predetermined time intervals with the pulse signal.

Some of the advantages of some battery presence detection systems according to exemplary embodiments are:

Power consumption minimized, as implementation does not require any continuously powered blocks like continuous time comparators, or constant current flowing through a resistive divider. Power consumption is function of total amount of line capacitance and operation frequency. The smaller the capacitance the less power is needed.

Operation frequency can be chosen quite freely, e.g., a maximum operating frequency depends on, for example, the overall time constant of BDET line and reference level of pulse detector.

Being a discrete (digital type) solution, smart battery digital communication protocols may share same physical line (i.e. the battery detection line) yielding an embodiment of the battery presence detection system with a less complex overall structure.

Mobile terminals have usually always running 32.768 KHz oscillators, for usage as the real time clock. So in practice, the battery presence detection systems according to some exemplary embodiments may reuse the 32.768 kHz oscillator signal as the pulse signal. Alternatively, other pulse signal frequencies can be used.

The battery presence detection systems according to exemplary embodiments function for a wider range of pull-down resistor values than the conventional battery presence detection systems.

The disclosed exemplary embodiments provide a system and a method for detecting battery presence in a device with a reduced consumption of energy and at a low cost. It should be understood that this description is not intended to limit the invention. On the contrary, the exemplary embodiments are intended to cover alternatives, modifications and equivalents, which are included in the spirit and scope of the invention as defined by the appended claims. For example, the aforedescribed exemplary embodiments could also be used also to detect the presence of peripheral devices other than batteries that have pull-down resistance. Furthermore, there could be alternatively be a pull-up resistor used in peripheral side (instead of a pull-down resistor) and therefore signaling polarities would be reversed but detection could otherwise be performed in the manner described above. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A battery presence detection circuit inside a device connectable to a battery, the battery presence detection circuit comprising:
   a terminal battery detection line configured to be connected to the battery when the battery is connected to the device;
   a terminal ground line configured to be connected to the battery when the battery is connected to the device;
   a terminal capacitance connected between the terminal battery detection line and the terminal ground line;
   a pulse generator configured to generate a line charging pulse signal applied to the terminal battery detection line; and
   a detector configured to detect a presence of one of a line voltage edge and a line voltage level on the terminal battery detection line, and to output an indication as to whether the battery is connected to the device, based on whether the one of the line voltage edge and the line voltage level is present on the terminal battery detection line in response to the line charging pulse signal.

2. A device, comprising:
   a peripheral presence detection system inside the device, including:
   a terminal communication line;
   a terminal ground line; and
   a detector configured to detect a presence of one of a line voltage edge and a line voltage level on the terminal communication line occurring in response to a line charging pulse signal applied by the device to the terminal communication line, and to output an indication of whether a peripheral is connected to the device based on the detected presence,
   wherein the terminal communication line and the terminal ground line are connectable to corresponding lines of the peripheral.

3. The device of claim 2, further comprising:
   a pulse generator configured to generate the line charging pulse signal applied to the terminal communication line.

4. The device of claim 2, wherein the indication output by the detector is a first voltage value if the line voltage edge or the line voltage level of the voltage on the terminal communication line is detected at a predetermined time after applying the charging pulse signal, and a second voltage value if the line voltage edge or the line voltage level of the voltage on the terminal communication line is not detected at said predetermined time.

5. The device of claim 2, further comprising:
   a control unit configured to receive the indication from the detector, and to shut down the device in a controlled manner when the indication is that the peripheral is not connected to the device.

6. The device of claim 5, wherein the control unit shuts down the detector when shutting down the device in the controlled manner.

7. The device of claim 2, wherein the detector is a level detector determining whether a voltage on the terminal communication line becomes larger than a predetermined level.

8. The device of claim 2, wherein the detector is a rising edge detector determining whether a rising edge of a voltage on the terminal communication line is present.

9. The device of claim 3, further comprising:
   a remnant power source providing power to the pulse generator when the peripheral becomes disconnected.

10. The device of claim 9, wherein the remnant power source is a clock signal generating unit.

11. The device of claim 9, wherein the remnant power source is a temporary power storage unit that is discharged at a slow rate after the peripheral becomes disconnected.

12. The device of claim 2, wherein a time interval between when the peripheral is disconnected and when the detector outputs the indication that the peripheral is disconnected is less than 500 µs.

13. The device of claim 3, wherein the pulse generator operates at a frequency of at least 20 KHz.

14. The device of claim 3, further comprising:
   a battery type adjusting unit that adjusts at least one of a pulse generator frequency and voltage reference levels used by the detector to detect the presence of the one of the line voltage edge and the line voltage level, according to values of a pull-down resistor and a capacitance between the terminal communication line and the terminal ground line when the peripheral is connected.

15. The device of claim 3, wherein the pulse generator is connected to the detector to enable the detector to synchronize a detector sampling pulse train used to select the predetermined times in the detector with the pulse signal.

16. The device of claim 2, further comprising
   a digital debounce filter connected to an output of the detector.

17. A method for detecting by a device whether a battery is connected to the device, the method comprising:
   applying by the device a line charging pulse signal to a terminal battery detection line
   detecting whether one of a line voltage edge and a line voltage level of a voltage on the terminal battery detection line occurs on the terminal battery detection line in response to the line charging pulse; and
   determining whether the battery is connected to the device based on the detecting,
   wherein the terminal battery detection line is connected to a ground line via a pull down resistor and a capacitance while the battery is connected to the device.

18. The method of claim 17, further comprising:
   outputting a first voltage value if determined that the battery is connected to the device, and a second voltage value if determined that the battery is disconnected from the device.

19. The method of claim 17, further comprising:
   shutting down the device in a controlled manner when the determining concludes that the battery is not connected to the device.

20. The method of claim 17, further comprising:
   adjusting at least one of a pulse generator frequency of the pulse signal and voltage reference levels used to detect whether the one of the line voltage edge and the line voltage level on the terminal battery detection line is present, according to values of the pull-down resistor and the capacitance.

* * * * *